Jan. 28, 1969 B. H. DANN 3,425,000
TRANSISTORIZED MULTIVIBRATOR MODULATOR
Filed Aug. 8, 1966
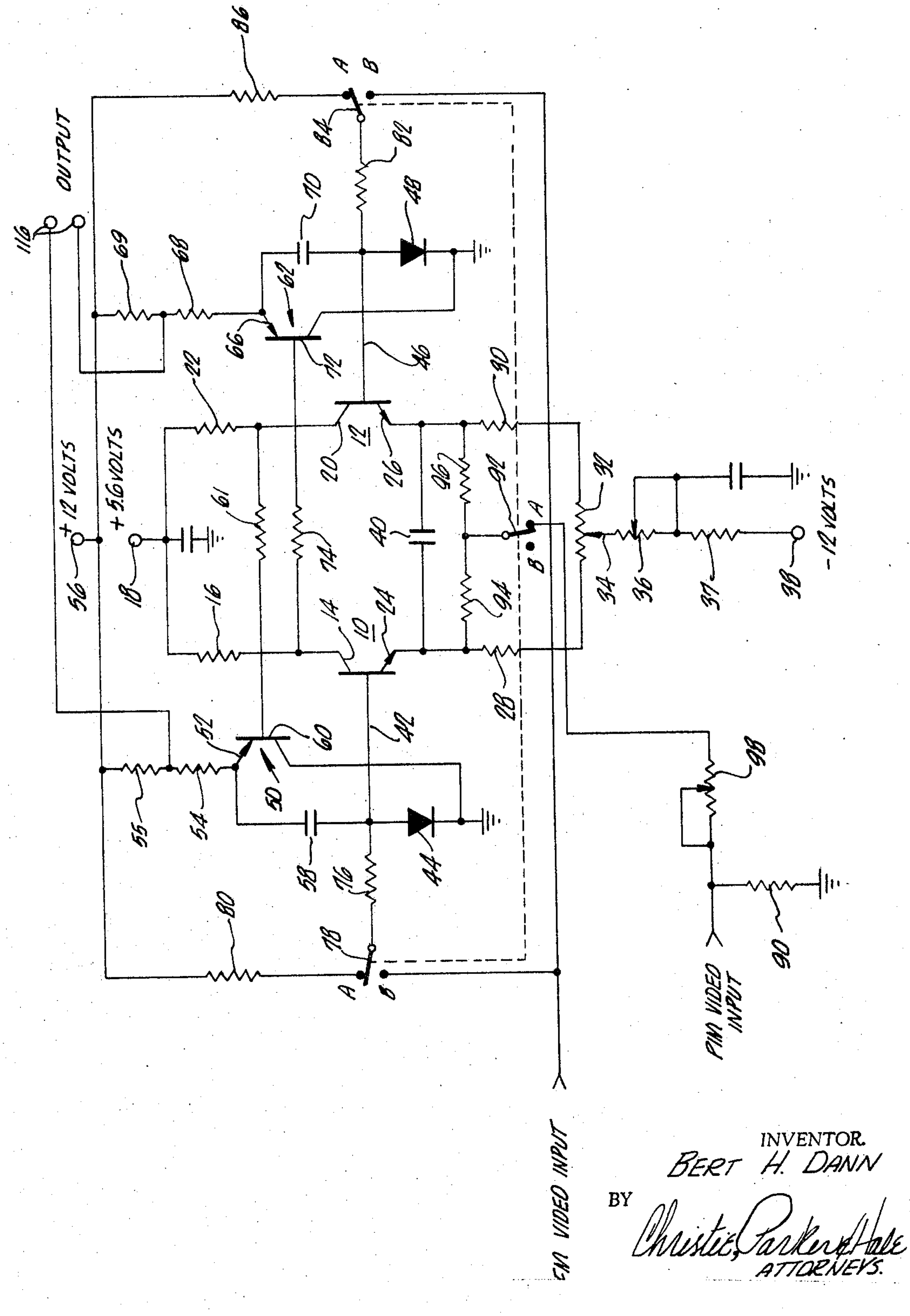
INVENTOR.
BERT H. DANN
BY
Christie, Parker & Hale
ATTORNEYS.

United States Patent Office 3,425,000
Patented Jan. 28, 1969

3,425,000
TRANSISTORIZED MULTIVIBRATOR MODULATOR

Bert H. Dann, Altadena, Calif., assignor to Bell & Howell Company, Chicago, Ill., a corporation of Illinois Filed Aug. 8, 1966, Ser. No. 570,887
U.S. Cl. 332—16 4 Claims
Int. Cl. H03c *3/00*

This invention relates to time modulation circuits for video recording and, more particularly, is concerned with a modulator which can be used either for frequency modulation or period modulation of a carrier signal by a video signal for magnetic tape recording.

In copending application Ser. No. 473,100, filed July 19, 1965, now Patent No. 3,371,288 issued Feb. 27, 1968, in the name of the present inventor and assigned to the same assignee as the present invention, there is described a period modulation circuit which utilizes a pair of transistors and six diodes. In order to provide dependable starting of oscillations in the circuit described in the above-identified application, resistors were provided in series with the collector-clamping diodes in order to preserve adequate loop gain. This presents a problem in fully reverse-biasing the "off" diode with small collector-voltage swings.

The present invention is directed to an improved modulator circuit which provides for reliable operation at much higher carrier frequencies. The circuit can be operated either as a period modulator or a frequency modulator with a slight modification in the circuit design.

In brief, the circuit of the present invention includes first and second transistors with the collectors connected through load resistors to a first potential. The emitter current of either transistor when conducting is limited by a large resistor connecting the emitter to a second potential. The bases of the transistors are clamped to a reference potential by diodes. The base of each transistor is coupled to the collector of the other transistor by a circuit including a transistor stage in which the emitter is coupled through a capacitor to the base of the one transistor and its base connected to the collector of the other transistor. The collector of the coupling transistor stage is connected to a reference potential such as ground, while the emitter is connected through an emitter load resistor to a potential source. When operated as a period modulation circuit, the modulating input signal is coupled to the emitters of the first and second transistors to control the emitter current level in response to the instantaneous amplitude of the input signal. When operated as a frequency modulation circuit, the base electrodes of the two transistors are connected through resistors to the video input signal so that the discharge time of the respective coupling capacitors on alternate half cycles is controlled by the modulating signal.

For a more complete understanding of the invention, reference should be made to the accompanying drawing wherein the single figure is a schematic circuit diagram of the modulation circuit of the present invention.

Referring to the drawing in detail, the numerals 10 and 12 indicate generally a pair of NPN-junction transistors. The collector 14 of the transistor 10 is connected through a load resistor 16 to a first potential applied at a terminal 18. Similarly, the collector 20 of the transistor 12 is connected through a load resistor 22 to the first potential at the terminal 18.

The emitter 24 of the transistor 10 and the emitter 26 of the transistor 12 are connected respectively through matched resistors 28 and 30 and a balancing potentiometer 32 having an adjustable tap 34 connected through a variable resistor 36 and series resistor 37 to a second potential applied at the terminal 38. Adjustment of the balancing potentiometer 32 permits exact adjustment of output-waveform symmetry and could be eliminated by making resistors 28 and 30 precision resistors. The variable resistor 36 permits the carrier rate of the modulator to be set at a desired frequency with some given modulating signal level at the input. The resisitors 28 and 30 actually form a common impedance at the switching frequencies of the modulator circuit due to a capacitor 40 connected between the emitters 24 and 26. The base 42 of the transistor 10 is claimed to ground potential by a diode 44 during one semi-period of the output signal. Similarly, the base 46 of the transisitor 12 is clamped to ground potential by diode 48 during the other semi-period of the output signal.

The feedback circuits between the transistor 12 and the transistor 10 include a third transistor indicated at 50, which acts as an emitter follower with the emitter electrode 52 connected through a pair of series load resistors 54 and 55 to a potential applied to a terminal 56. The emitter 52 is also coupled through a capacitor 58 to the base of the transistor 10. The base 60 of the coupling transistor 50 is connected through a resistor 61 to the collector 20 of the transistor 12.

Similarly, an emitter follower couples the collector 14 of the transistor 10 to the base 46 of the transistor 12. The fourth transistor, indicated generally at 62, has its emitter 66 connected through a pair of series load resistors 68 and 69 to the potential applied to the terminal 56. The emitter 66 is also coupled through a capacitor 70 to the base 46 of the transistor 12. The base 72 of the coupling transistor 62 is connected to a resistor 74 to the collector 14 of the transistor 12. The resistors 61 and 74 are for suppression of any parasitic oscillations in the circuit.

When operated as a period modulator, the base electrodes 42 and 46 of the transistors 10 and 12 are connected to a fixed bias. Thus the base 42 is connected through a resistor 76, a double-pole switch 78 set in position A, and a resistor 80 back to the terminal 56. The switch 78 is in position A when the circuit is operated as a period modulator and is placed in position B when it is operated as a frequency modulator. Similarly, the base 46 of the transistor 12 is connected through a resistor 82, a switch 84 which is ganged with the switch 78, and a resistor 86 back to the terminal 56.

When operated as a period modulator, a video input signal, for example, is applied across an input resistor 90 and provides a control for the emitter current of the respective transistors 10 and 12 by being connected through a switch 92 ganged with the switches 78 and 84 and through a pair of resistors 94 and 96 which are connected respectively to the emitters 24 and 26 of the transistors 10 and 12. A variable resistor 98 in series with the input signal controls the level of modulation.

When operated as a frequency modulator, the switches 78, 84, and 92 are put in position B. In this case, the rate of discharge of the respective coupling capacitors 58 and 70 is controlled by the modulating input signal, which signal controls the voltage level at the switch end of the resistors 76 and 82.

The modulator carrier output is derived across a pair of output terminals 116 which are connected respectively to the junction of resistors 54 and 55 and the junction of resistors 68 and 69.

Typical values of the resistors and capacitors in the above-described circuit for a carrier range of 2.8 to 4.0 megacycles per second are given below.

| | | |
|---|---|---|
| Resistors 16 and 22 | ohms | 220 |
| Resistors 28 and 30 | do | 1330 |
| Potentiometer 32 | do | 100 |

| | | |
|---|---|---|
| Resistor **36** | ohms | 250 |
| Resistor **37** | do | 240 |
| Resistors **54** and **68** | do | 510 |
| Resistors **55** and **69** | do | 200 |
| Resistors **76** and **82** | do | 4750 |
| Resistors **80** and **86** | do | 5620 |
| Capacitors **58** and **70** | pf | 100 |

In operation as a period modulator, the above-described circuit operates substantially in the manner of the circuit described in the above-identified copending application. When operated as a frequency modulator, the emitter current of both transistors is held constant, which fixes the potential to which the coupling capacitors are discharged. However, the discharge current and hence the discharging rate are controlled by the level of the input signal. Typically the input level swings between +4.5 volts and 8 volts.

In the present circuit, any collector clamping diodes have been eliminated and the collector resistors in the present circuit are returned to an intermediate potential. When either transistor is turned off, its collector rises to the intermediate potential and when either transistor is on, its collector potential is determined by the total available emitter current flowing through the resistors 28 and 30 plus any current provided by the input signal. By having separate emitter resistors, a means is provided for balancing the voltage excursion of the bases of the transistors 10 and 12 during "on" and "off" operation. Secondly, by having two resistors, each transistor must draw substantially the same emitter current and therefore both transistors operate in a linear region with resulting high loop gain when power is initially applied. This ensures proper starting of oscillations of the modulator circuit.

Apart from providing increased loop gain, the additional coupling transistors 60 and 62 improve the overall operation of the circuit at higher frequencies. Assume that the collector 20 of the transistor 12 has just gone positive to the supply voltage of 5.6 volts. Hence the base 60 of the transistor 50 has also risen to approximately the same voltage. The total current flowing in the emitter resistor 54 is now available for the purpose of recharging the capacitor 58 since, if necessary, the transistor 50 will cut off completely. Thus the capacitor 58 charges rapidly towards the positive potential until clamped by transistor 50 going in full conduction. This low impedence charging of the coupling capacitors 58 and 70 permits a considerable increase in their relative size over what has heretofore been practical. The desired switching rate can still be maintained then by decreasing the size of the base-charging resistors 76 and 82. The large coupling capacitors minimize any non-symmetry resulting from stray capacitance and/or unequal capacitance of diodes and transistors, particularly the stored charges of the base-clamping diodes 44 and 48.

What is claimed is:

1. A modulator comprising first and second transistors, each having a base, collector, and emitter, a pair of load resistors respectively connecting the two collectors to a first potential, resistor means connecting the two emitters to a second potential, a pair of diodes respectively connecting the two bases to a third potential intermediate the first and second potentials, third and fourth transistors each having a base, collector, and emitter, a pair of capacitors respectively connecting the emitters of the third and fourth transistors to the bases of the first and second transistors, a pair of resistors respectively connecting the bases of the third and fourth transistors to the collectors of the first and second transistors, a pair of resistors respectively connecting the emitters of the third and fourth transistors to a fourth potential, means coupled to the bases of the first and second transistors tending to bias the transistors into a conductive state, and means responsive to the voltage difference between the emitters of the third and fourth transistors for providing an output signal.

2. Apparatus as defined in claim 1 further including a capacitor connected between the emitter of the first and second transistor.

3. Apparatus as defined in claim 1 including means for coupling a modulating input signal to the bases of the first and second transistors.

4. Apparatus as defined in claim 1 including means for coupling an input signal to the emitters of the first and second transistors.

References Cited

UNITED STATES PATENTS

| | | | |
|---|---|---|---|
| 2,874,315 | 2/1959 | Reichert | 331—113 |
| 3,013,220 | 12/1961 | Norris | 332—14 X |
| 3,077,567 | 2/1963 | Gray | 332—16 |
| 3,371,288 | 2/1968 | Dann | 332—14 |

ALFRED L. BRODY, *Primary Examiner*.

U.S. Cl. X.R.

307—288; 331—113; 332—14